(12) United States Patent  
d'Estries et al.

(10) Patent No.: US 7,358,600 B1
(45) Date of Patent: Apr. 15, 2008

(54) INTERPOSER FOR INTERCONNECTING COMPONENTS IN A MEMORY CARD

(75) Inventors: Maximilien d'Estries, Mesa, AZ (US); Stephen G. Shermer, Chandler, AZ (US); Jeffrey A. Miks, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 316 days.

(21) Appl. No.: 10/990,265

(22) Filed: Nov. 16, 2004

Related U.S. Application Data

(63) Continuation-in-part of application No. 10/427,117, filed on May 1, 2003, now Pat. No. 7,095,103.

(51) Int. Cl.
*H01L 23/02* (2006.01)

(52) U.S. Cl. ............ 257/686; 257/E25.01; 257/E25.02

(58) Field of Classification Search ................ 257/686, 257/777
See application file for complete search history.

(56) References Cited

U.S. PATENT DOCUMENTS

| | | |
|---|---|---|
| 3,668,299 A | 6/1972 | McNeal |
| 4,532,419 A | 7/1985 | Takeda |
| 4,905,124 A | 2/1990 | Banjo et al. |
| 4,974,120 A | 11/1990 | Kodai et al. |
| 5,172,214 A | 12/1992 | Casto |
| 5,360,992 A | 11/1994 | Lowrey et al. |
| 5,574,309 A | 11/1996 | Papaietro et al. |
| 5,742,479 A | 4/1998 | Asakura |
| 5,753,532 A | 5/1998 | Sim |
| 5,784,259 A | 7/1998 | Asakura |
| 5,789,280 A | 8/1998 | Yokota et al. |
| 5,808,359 A | 9/1998 | Muto et al. |
| 5,822,190 A | 10/1998 | Iwasaki |
| 5,893,724 A | 4/1999 | Chakravorty et al. |
| 5,977,613 A | 11/1999 | Takata et al. |
| 5,977,640 A * | 11/1999 | Bertin et al. ................. 257/777 |
| 6,040,622 A | 3/2000 | Wallace |
| 6,057,598 A * | 5/2000 | Payne et al. ................. 257/723 |
| 6,143,981 A | 11/2000 | Glenn |
| 6,215,193 B1 * | 4/2001 | Tao et al. ................... 257/777 |
| D445,096 S | 7/2001 | Wallace |
| D446,525 S | 8/2001 | Okamoto et al. |
| 6,300,163 B1 * | 10/2001 | Akram ........................ 438/108 |
| 6,329,713 B1 * | 12/2001 | Farquhar et al. ............ 257/712 |
| 6,376,283 B1 | 4/2002 | Chen |

(Continued)

FOREIGN PATENT DOCUMENTS

JP  3112688  5/1991

(Continued)

*Primary Examiner*—David A. Zarneke
(74) *Attorney, Agent, or Firm*—Stetina Brunda Garred & Brucker

(57) ABSTRACT

A circuit module for use in a memory card. The circuit module comprises a base substrate including a plurality of contacts. Attached to the base substrate is a memory die, while attached to the memory die is an interposer having a plurality of terminals electrically connected to each other in a prescribed pattern. At least one of the terminals is electrically connected to at least one of the contacts. Attached to the interposer is a controller die, with the memory die and the controller die each being electrically connected to at least one of the terminals of the interposer.

20 Claims, 3 Drawing Sheets

U.S. PATENT DOCUMENTS

| | | |
|---|---|---|
| 6,384,472 B1 | 5/2002 | Huang |
| 6,462,273 B1 | 10/2002 | Corisis et al. |
| 6,476,469 B2 | 11/2002 | Hung et al. |
| 6,545,332 B2 | 4/2003 | Huang |
| 6,603,196 B2 | 8/2003 | Lee et al. |
| 6,624,005 B1 | 9/2003 | DiCaprio et al. |
| 6,713,856 B2 * | 3/2004 | Tsai et al. ............ 257/686 |
| 6,768,190 B2 * | 7/2004 | Yang et al. ........... 257/686 |
| 6,777,799 B2 * | 8/2004 | Kikuma et al. ....... 257/686 |
| 6,815,829 B2 * | 11/2004 | Shibata ................ 257/777 |
| 6,836,002 B2 * | 12/2004 | Chikawa et al. ...... 257/666 |
| 6,849,932 B2 * | 2/2005 | Tsai et al. ............ 257/675 |
| 6,875,025 B2 * | 4/2005 | Hsu et al. ............. 439/71 |
| 6,906,415 B2 * | 6/2005 | Jiang et al. ........... 257/723 |
| 6,979,904 B2 * | 12/2005 | Farnworth et al. .... 257/777 |
| 7,002,255 B2 * | 2/2006 | Wang ................... 257/777 |
| 7,189,593 B2 * | 3/2007 | Lee ...................... 438/107 |
| 2002/0140068 A1 | 10/2002 | Lee |
| 2004/0173914 A1 * | 9/2004 | Kurihara et al. ...... 257/778 |
| 2005/0224944 A1 * | 10/2005 | Biar et al. ............ 257/686 |

FOREIGN PATENT DOCUMENTS

| | | |
|---|---|---|
| JP | 7017175 | 1/1995 |
| JP | 8190615 | 7/1996 |
| JP | 10334205 | 12/1998 |

\* cited by examiner

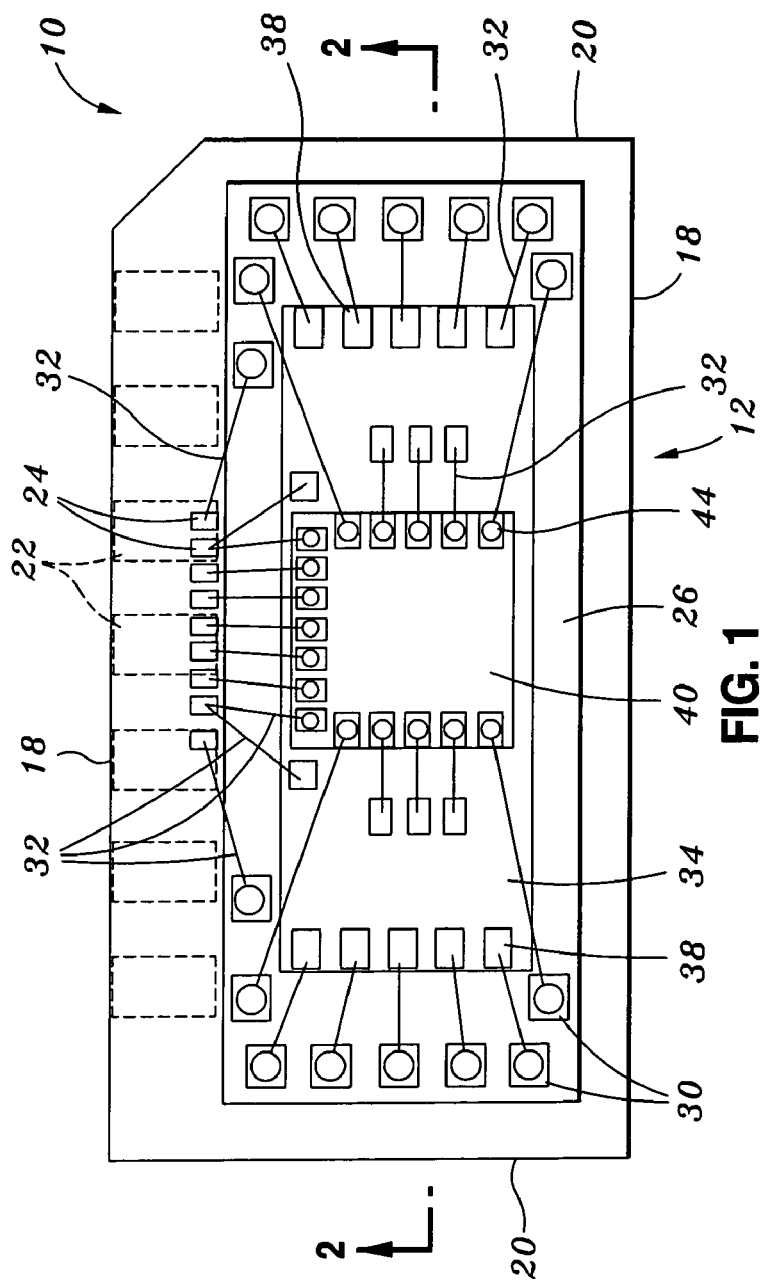
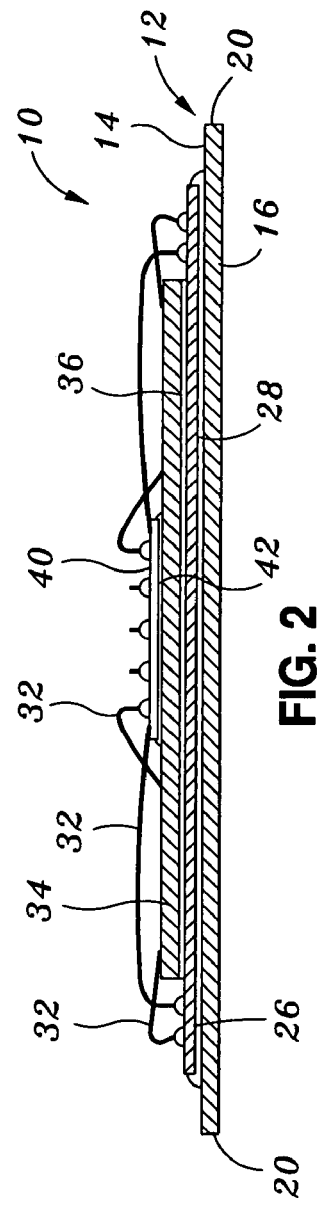

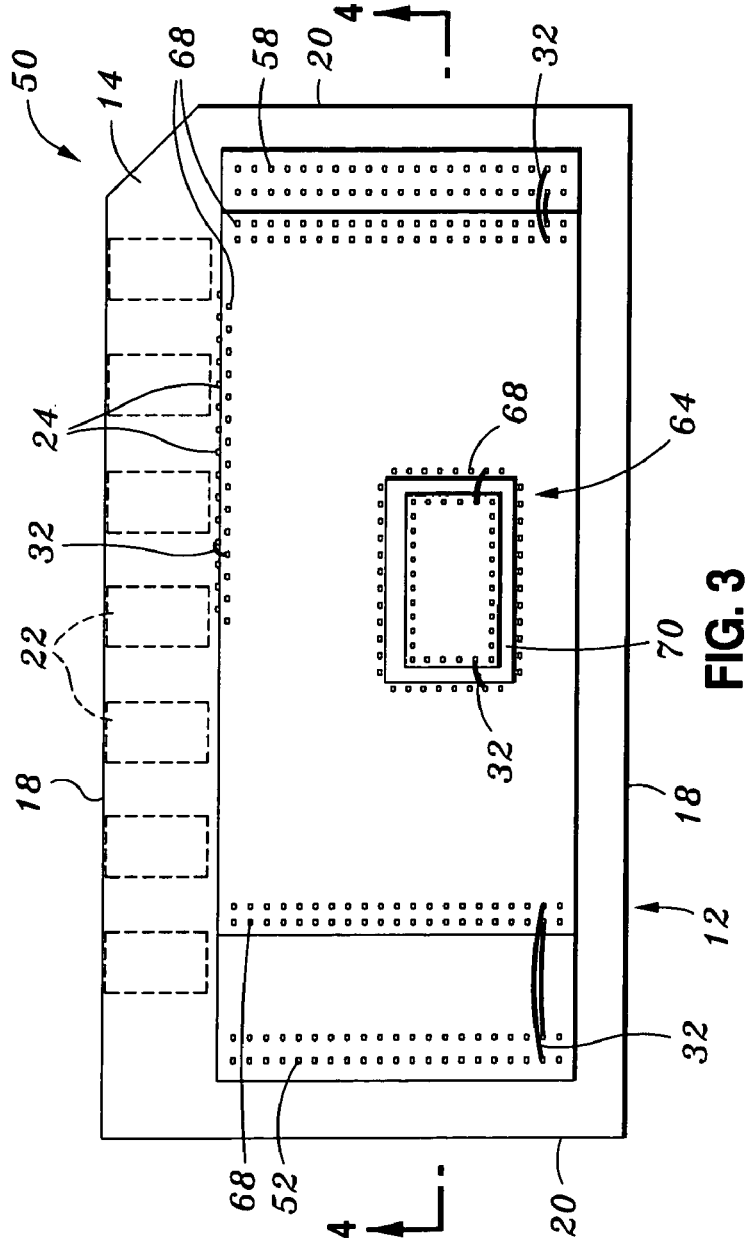
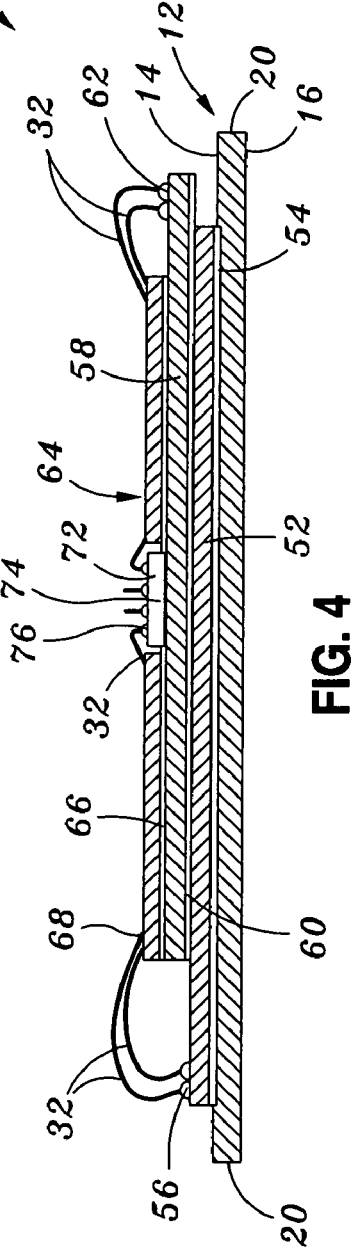

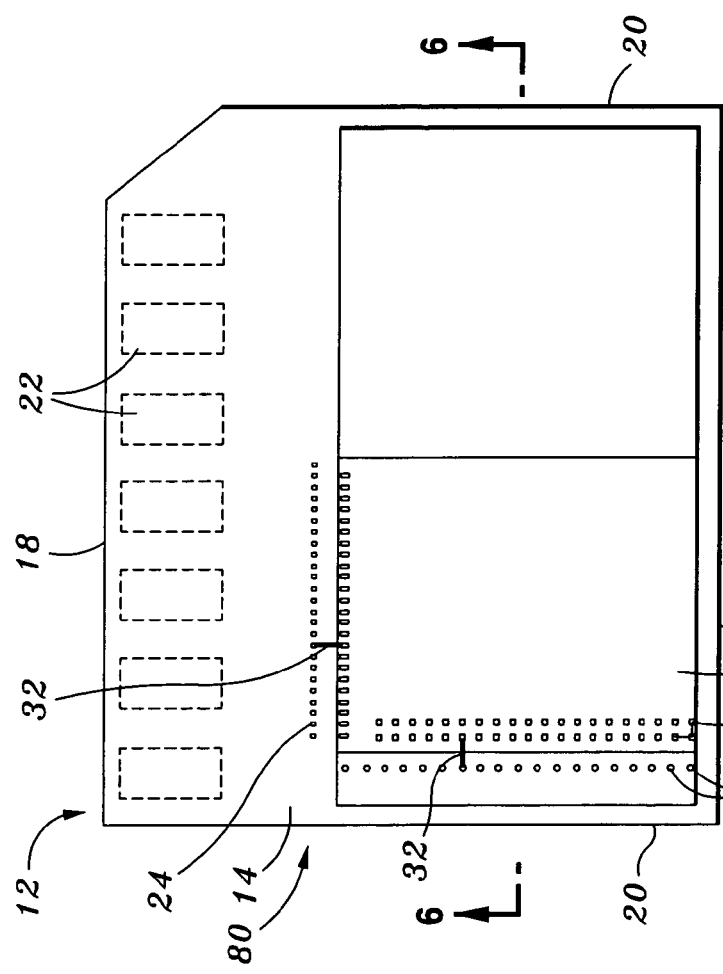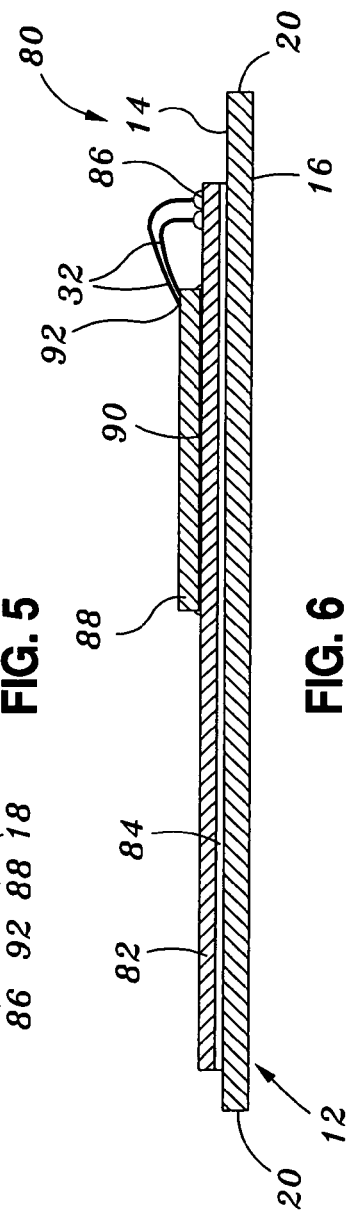

INTERPOSER FOR INTERCONNECTING COMPONENTS IN A MEMORY CARD

CROSS-REFERENCE TO RELATED APPLICATIONS

The present application is a continuation-in-part of U.S. application Ser. No. 10/427,117 entitled LEADFRAME BASED MULTI MEDIA CARD filed May 1, 2003, now U.S. Pat. No. 7,095,103, the disclosure of which is incorporated herein by reference.

STATEMENT RE: FEDERALLY SPONSORED RESEARCH/DEVELOPMENT

Not Applicable

BACKGROUND OF THE INVENTION

The present invention relates generally to memory cards, and more particularly to a laminate interposer for use as an interconnect and jump off point for wire bonding in a memory card.

As is well known in the electronics industry, memory cards are being used in increasing numbers to provide memory storage and other electronic functions for devices such as digital cameras, MP3 players, cellular phones, and personal digital assistants. A memory card typically comprises a circuit module which is partially enclosed in a housing of the card or is partially covered by a plastic encapsulant material which hardens into a body of the card. Memory cards are currently provided in various formats, including multi-media cards (MMC), secure digital cards (SDC), compact flash (CF), smart media, and memory stick.

Typically, the circuit module of a memory card includes multiple integrated circuit devices or semiconductor dies. The dies are interconnected using a circuit board substrate which adds to the weight, thickness, stiffness and complexity of the module. Circuit modules also include electrical contacts for providing an external interface to an insertion point or socket. These electrical contacts are typically disposed on the back side of the circuit board substrate, with the electrical connection to the dies being provided by vias which extend through the circuit board substrate.

In an effort to simplify the process steps needed to fabricate the circuit module and, hence, the memory card using the same, there has been developed by Applicant a circuit module wherein a leadframe assembly is used as an alternative to the circuit board substrate, as described in Applicant's co-pending U.S. application Ser. No. 09/956,190 entitled LEAD-FRAME METHOD AND ASSEMBLY FOR INNERCONNECTING CIRCUITS WITHIN A CIRCUIT MODULE filed Sep. 19, 2001 and Ser. No. 10/266,329 entitled DIE DOWN MULTI-MEDIA CARD AND METHOD OF MAKING SAME filed Oct. 8, 2002, the disclosures of which are also incorporated herein by reference.

As portable memory, game and I/O cards continue to miniaturize, making efficient use of available internal housing or body area becomes of paramount importance. In this regard, reduced size game, memory, and I/O cards will not allow for large memory devices along with complimentary controller devices due to the relatively small housing or body outline. Due to the nature of memory cards in general, the workable area within the memory card is extremely limited in the X,Y and Z directions. Large die sizes also compound the problem of fitting all customer required components in the limited space. The present invention addresses the above-described space availability limitation by providing a laminate interposer which is used as a sub-module within the circuit module of the memory card and facilitates the interconnect between semiconductor die and other components of the circuit module.

BRIEF SUMMARY OF THE INVENTION

In accordance with the present invention, there is provided a circuit module for use in a memory card. The circuit module includes a laminate interposer which is typically used on top of a large memory die of the card, thus allowing for full use of the main board area of the printed circuit board of the circuit module and further optionally allowing the card to be populated with a large memory die once thought to be too long for smaller card formats. The interposer integrated into circuit module of the present invention is used as an interconnect and jump off point for wire bonding. The interposer may also be used as a sub-module within the circuit module, with the typical location of the sub-module being on top of a larger memory die. The interposer of the present invention can also feasibly support the entire circuitry and components of the card.

In one embodiment of the present invention, the circuit module comprises a base laminate or substrate having a semiconductor die (e.g., a memory die) secured to one side of face thereof. Attached to the exposed face of the memory die is a sub-module comprising the laminate interposer of the present invention which itself has a controller die mounted thereto. The interposer is sized and configured to facilitate a desired pattern of electrical interconnection between the controller die and the underlying memory die.

In accordance with a second embodiment of the present invention, the interposer is provided with an opening which is sized and configured to accommodate the controller die. This alternative configuration of the sub-module (including the laminate interposer and the controller die) within the circuit module allows for the stacking of multiple items in the circuit module while staying within prescribed height limitations.

In accordance with a third embodiment of the present invention, the interposer is attached to an exposed surface of a memory die which is itself attached to the base substrate of the circuit module. In the third embodiment, the size of the memory die prevents direct electrical connection through wire bonding to the base substrate, with the interposer mounted to the memory die thus being used to facilitate the electrical connection thereof to the base substrate.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein:

FIG. 1 is a top plan view of a circuit module which is constructed in accordance with a first embodiment of the present invention;

FIG. 2 is cross-sectional view of the circuit module of the first embodiment taken along line 2-2 of FIG. 1;

FIG. 3 is a top perspective view of a circuit module constructed in accordance with a second embodiment of the present invention;

FIG. 4 is a cross-sectional view of the circuit module of the second embodiment taken along line 4-4 of FIG. 3;

FIG. 5 is a top plan view of a circuit module constructed in accordance with a third embodiment of the present invention; and FIG. 6 is a cross-sectional view of the circuit module of the third embodiment taken along line 6-6 of FIG. 5.

Common reference numerals are used throughout the drawings and detailed description to indicate like elements.

DETAILED DESCRIPTION OF THE INVENTION

Referring now to the drawings wherein the showings are for purposes of illustrating preferred embodiments of the present invention only, and not for purposes of limiting the same, FIGS. 1 and 2 illustrate a circuit module 10 constructed in accordance with a first embodiment of the present invention. It is contemplated that the circuit module 10 will be integrated into a memory card in a manner which will be described in more detail below.

The circuit module 10 comprises a base substrate 12 which is preferably a laminate, and defines opposed, generally planar top and bottom surfaces 14, 16. In addition to the top and bottom surfaces 14, 16, the base substrate 12 defines an opposed pair of longitudinal sides or peripheral edge segments 18, and an opposed pair of lateral sides or peripheral edge segments 20. Disposed on the bottom surface 16 of the base substrate 12 are a plurality of external signal contacts 22. As is best seen in FIG. 1, contacts 22 extend along one of the longitudinal sides 18 of the base substrate 12 in spaced relation to each other. Disposed on the top surface 14 of the base substrate 12 are conductive pads 24. The conductive pads 24 are each placed into electrical communication with one or more of the contacts 22 by conductive vias and/or traces which extend along the top and bottom surfaces 14, 16 of and/or through the base substrate 12.

In addition to the base substrate 12, the circuit module 10 of the first embodiment comprises a memory die 26, the bottom surface of which is attached to the top surface 14 of the base substrate 12 via a layer 28 of an epoxy adhesive. Disposed on the top surface of the memory die 26 are a plurality of terminals 30, at least one of which is electrically connected to at least one of the pads 24 of the base substrate 12 via a conductive wire 32. As seen in FIG. 1, two of the terminals 30 of the memory die 26 are electrically connected to respective ones of the pads 24 via a pair of wires 32.

In the circuit module 10 of the first embodiment, disposed on the top surface of the memory die 26 is a laminate interposer 34 constructed in accordance with the present invention. The interposer 34 defines opposed, generally planar top and bottom surfaces, with the bottom surface of the interposer 34 being attached to the top surface of the memory die 26 via a film adhesive 36. Disposed on the top surface of the interposer 34 are a plurality of terminals 38. It is contemplated that the terminals 38 of the interposer 34 may be placed into electrical communication with each other in any one of a multiplicity of different patterns through the use of conductive traces and/or vias extending along the top surface of and/or within the interposer 34. As is further seen in FIG. 1, some of the terminals 38 of the interposer 34 are depicted as being electrically connected to respective ones of the terminals of the memory die 26 via wires 32, with a pair of the terminals 38 being depicted as electrically connected to respective ones of the pads 24 of the base substrate 12 via wires 32.

The circuit module 10 of the first embodiment further comprises a controller die 40, the bottom surface of which is attached to the top surface of the interposer 34 via a layer 42 of an epoxy adhesive. Disposed on the top surface of the controller die 40 are a plurality of terminals 44. As best seen in FIG. 1, some of the terminals 44 are shown as being electrically connected to respective ones of the pads 24 of the base substrate 12 through the use of conductive wires 32. Other terminals 44 are shown as being electrically connected to respective ones of the terminals 30 of the memory die 26 through the use of wires 32, with still other terminals 44 of the controller die 40 being shown as electrically connected to respective ones of the terminals 38 of the interposer 34 through the use of wires 32. Thus, as is apparent from FIGS. 1 and 2, it is contemplated that within the circuit module 10, the memory die 26, interposer 34, and controller die 40 may be placed into direct electrical communication with the base substrate 12, and/or indirectly electrically connected thereto via the interposer 34. The memory and controller dies 26, 40 may also be placed into direct electrical communication with each other, and/or indirectly electrically connected to each other via the interposer 34. Importantly, it is contemplated that the interposer 34 may be used to facilitate any desired pattern of electrical interconnection between the memory and controller dies 26, 40 and the base substrate 12. Those of ordinary skill in the art will recognize that the particular pattern of electrical interconnection shown in FIGS. 1 and 2 and described above is exemplary only, the present invention not being limited to any particular pattern of electrical interconnection between the base substrate 12, memory die 26, interposer 34 and controller die 40. It is further contemplated that the memory die 26 and/or controller die 40 may be substituted with semiconductor packages of differing functionality.

As indicated above, the circuit module 10 having the above-described structural attributes is adapted to be integrated into a memory card. In this regard, the circuit module 10 may be enclosed or encased within two housing halves which, when joined together, collectively achieve a prescribed form factor for the memory card. As will be recognized, such housing will be configured in a manner wherein the contacts 22 of the base substrate 12 are exposed in the housing in a manner capable of being placed into direct contact and hence electrical communication with the connector pins of a host socket. Alternatively, an encapsulant material (e.g., thermoset, thermoplastic) may be applied to the circuit module 10 so as to form a body of the memory card upon the hardening thereof. As will be recognized, the body formed by the hardened encapsulant material may be formed to provide the necessary form factor for the memory card incorporating the circuit module 10. In the memory card 10 including the body, it is contemplated that at least the contacts 22 of the base substrate 12 will be exposed in such body and thus placeable into electrical communication with the connector pins of a host socket. Advantageously, the inclusion of the interposer 34 within the circuit module 10 of the completed memory card maximizes the effective utilization of available space within the interior of the body or housing of the card.

Referring now to FIGS. 3 and 4, there is shown a circuit module 50 constructed in accordance with a second embodiment of the present invention. The circuit module 50 comprises the above-described base substrate 12, the structural attributes of which are described above in relation to the circuit module 10 of the first embodiment.

In addition to the base substrate 12, the circuit module 50 of the second embodiment comprises a first memory die 52, the bottom surface of which is attached to the top surface 14 of the base substrate 12 via a layer 54 of an epoxy adhesive or an adhesive film. Disposed on the top surface of the first memory die 52 are a plurality of terminals 56. It is contemplated that at least one of the terminals 56 may be electrically connected to a respective one of the pads 24 of the base substrate 12 via a conductive wire 32. Disposed on the top surface of the first memory die 52 is a second memory die 58. The bottom surface of the second memory die 58 is attached to the top surface of the first memory die 52 via a layer 60 of an epoxy adhesive or a conductive film. Disposed on the top surface of the second memory die 58 are a plurality of terminals 62. It is contemplated that at least one of the terminals 62 of the second memory die 58 may be electrically connected to a respective one of the pads 24 of the base substrate 12 via a conductive wire 32.

In the circuit module 50 of the second embodiment, disposed on the top surface of the second memory die 58 is a laminate interposer 64 constructed in accordance with the present invention. The interposer 64 defines opposed, generally planar top and bottom surfaces, with the bottom surface of the interposer 64 being attached to the top surface of the second memory die 58 via a layer 66 of an epoxy adhesive or an adhesive film. Disposed on the top surface of the interposer 64 are a plurality of terminals 68. It is contemplated that the terminals 68 of the interposer 64 may be placed into electrical communication with each other in any one of a multiplicity of different patterns through the use of conductive traces and/or vias extending along the top surface of and/or within the interposer 64. Additionally, disposed within the interposer 64 is a generally quadrangular opening 70, the use of which will be described below.

The circuit module 50 of the second embodiment further comprises a controller die 72 which is disposed within the opening 70 defined by the interposer 64. The bottom surface of the controller die 72 is attached to the top surface of the second memory die 58 via a layer 74 of an epoxy adhesive or an adhesive film. Disposed on the top surface of the controller die 72 are a plurality of terminals 76. As is seen in FIGS. 3 and 4, at least some of the terminals 76 of the controller die 72 are electrically connected to respective ones of the terminals 68 of the interposer 64 through the use of conductive wires 32. Further, some of the terminals 68 of the interposer 64 are shown in FIGS. 3 and 4 as being electrically connected to respective ones of the terminals 56, 62 of the first and second memory dies 52, 58 via wires 32, with at least one of the terminals 68 of the interposer 64 being electrically connected to a respective one of the pads 24 of the base substrate 12 via a wire 32. Thus, as is apparent from FIGS. 3 and 4, it is contemplated that within the circuit module 50, the first and second memory dies 52, 58 and controller die 72 may be placed into electrical communication with the base substrate 12 and hence the contacts 22 thereof via the interposer 64. However, those of ordinary skill in the art will recognize that the particular pattern of electrical interconnection shown in FIGS. 3 and 4 and described above is exemplary only, the present invention not being limited to any particular pattern of electrical interconnection between the base substrate 12, first and second memory dies 52, 58, interposer 64 and controller die 72. It is further contemplated that either the first memory die 52 or second memory die 58 may be eliminated from the circuit module 50, and that the first memory die 52, second memory die 58 and/or controller die 72 may be substituted with semiconductor packages of differing functionality.

The circuit module 50 having the above-described structural attributes is, like the circuit module 10 described above, adapted to be integrated into a memory card. In this regard, the circuit module 50 may be enclosed or encased within two housing halves or covered by an encapsulant material to form a memory card body in the same manner described above in relation to the circuit module 10 of the first embodiment. In such memory card, the contacts 22 of the base substrate 12 will be exposed in the housing or body thereof, and thus placeable into electrical communication with the connector pins of a host socket. The configuration of the circuit module 50 constructed in accordance with the second embodiment allows for the placement of the controller die 72 on top of the second memory die 58 through the opening 70 in the interposer 64. This feature allows for the stacking of multiple items in the circuit module 50 while staying within height limitations in the interior of the body or housing of the completed memory card.

Referring now to FIGS. 5 and 6, there is shown a circuit module 80 constructed in accordance with a third embodiment of the present invention. The circuit module 80 comprises the above-described base substrate 12, the structural attributes of which are described above in relation to the circuit module 10 of the first embodiment.

In addition to the base substrate 12, the circuit module 80 of the second embodiment comprises a memory die 82, the bottom surface of which is attached to the top surface 14 of the base substrate 12 via a layer 84 of an epoxy adhesive or an adhesive film. Disposed on the top surface of the memory die 82 are a plurality of terminals 86.

In the circuit module 80 of the third embodiment, disposed on the top surface of the memory die 82 is a laminate interposer 88 constructed in accordance with the present invention. The interposer 88 defines opposed, generally planar top and bottom surfaces, with the bottom surface of the interposer 88 being attached to the top surface of the memory die 82 via a layer 90 of an epoxy adhesive or adhesive film. Disposed on the top surface of the interposer 88 are a plurality of terminals 92. It is contemplated that the terminals 92 of the interposer 88 may be placed into electrical communication with each other in any one of a multiplicity of different patterns through the use of conductive traces and/or vias extending along the top surface of and/or within the interposer 88. As seen in FIGS. 5 and 6, at least one of the terminals 92 of the interposer 88 is shown as being electrically connected to a respective one of the terminals 86 of the memory die 82 via a conductive wire 32, with at least one of the terminals 92 being shown as electrically connected to a respective one of the pads 24 of the base substrate 12 via a conductive wire 32. Thus, as is apparent from FIGS. 5 and 6, it is contemplated that within the circuit module 80, the memory die 82 may be placed into electrical communication with the base substrate 12 and hence the contacts 22 thereof via the interposer 88 mounted to the top surface thereof. Those of ordinary skill in the art will recognize that the particular pattern of electrical interconnection shown in FIGS. 5 and 6 and described above is exemplary only, the present invention not being limited to any particular pattern of electrical interconnection between the base substrate 12, memory die 82, and interposer 88.

The circuit module 80 having the above-described structural attributes is also adapted to be integrated into a memory card. In this regard, the circuit module 80 may be enclosed or encased within two housing halves or covered by an encapsulant material to form a memory card body in the same manner described above in relation to the circuit module 10 of the first embodiment. In such memory card, the contacts 22 of the base substrate 12 will be exposed in the housing or body thereof, and thus placeable into electrical communication with the connector pins of a host socket. The configuration of the circuit module 80 constructed in accordance with the third embodiment allows memory dies such as the memory die 82 which would normally be too large to be placeable into electrical communication with the base substrate 12 to nonetheless be interfaced thereto through the use of the interposer 88. Thus, the inclusion of the interposer 88 within the circuit module 80 allows for the incorporation of a memory die into the completed memory card which is of a length just short of the maximum width of the base substrate 12, i.e., the distance separating the lateral sides 20 thereof from each other.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A circuit module for use in a memory card, the circuit module comprising:
   a base substrate including a plurality of contacts;
   a memory die attached to the base substrate;
   an interposer attached to the memory die and having a plurality of terminals electrically connected to each other in a prescribed pattern, at least one of the terminals being electrically connected to at least one of the contacts; and
   a controller die attached to the memory die;
   the memory die and the controller die each being electrically connected to at least one of the terminals of the interposer.

2. The circuit module of claim 1 wherein:
   the base substrate includes a plurality of conductive pads, each of which is electrically connected to at least one of the contacts; and
   at least one of the terminals of the interposer is electrically connected to a respective one of the pads via a conductive wire.

3. The circuit module of claim 2 wherein:
   the memory die is electrically connected to at least one of the terminals via a conductive wire; and
   the controller die is electrically connected to at least one of the terminals via a conductive wire.

4. The circuit module of claim 3 wherein the interposer at least partially circumvents the controller die.

5. The circuit module of claim 4 wherein the memory die and the controller die are electrically connected to each other via the interposer.

6. The circuit module of claim 2 wherein:
   the base substrate defines opposed top and bottom surfaces, the conductive pads being disposed on the top surface and the contacts being disposed on the bottom surface; and
   the memory die is attached to the top surface of the base substrate.

7. The circuit module of claim 1 wherein:
   the memory die is attached to the base substrate via an epoxy adhesive;
   the interposer is attached to the memory die via a film adhesive; and
   the controller die is attached to the memory die via an epoxy adhesive.

8. The circuit module of claim 1 wherein the terminals of the interposer are segregated into at least three sets, with at least one of the terminals of a first one of the sets being electrically connected to at least one of the contacts, at least one of the terminals of a second one of the sets being electrically connected to the memory die, and at least one of the terminals of a third one of the sets being electrically connected to the controller die.

9. The circuit module of claim 1 wherein the interposer has a generally quadrangular configuration defing multiple peripheral edge segments.

10. The circuit module of claim 9 wherein the interposer defines multiple peripheral edge segments, and the terminals of the first one of the sets and the second one of the sets thereof extend along respective ones of the peripheral edge segments.

11. A circuit module for use in a memory card, the circuit module comprising:
    a base substrate including a plurality of contacts;
    a memory die attached to the base substrate;
    an interposer attached to the memory die and having a plurality of terminals electrically connected to each other in a prescribed pattern, at least one of the terminals being electrically connected to at least one of the contacts, the interposer including an opening disposed therein; and
    a controller die disposed within the opening of the interposer and attached to the memory die;
    the memory die and the controller die each being electrically connected to at least one of the terminals of the interposer.

12. The circuit module of claim 11 wherein:
    the base substrate includes a plurality of conductive pads, each of which is electrically connected to at least one of the contacts; and
    at least one of the terminals of the interposer is electrically connected to a respective one of the pads via a conductive wire.

13. The circuit module of claim 12 wherein:
    the memory die is electrically connected to at least one of the terminals via a conductive wire; and
    the controller die is electrically connected to at least one of the terminals via a conductive wire.

14. The circuit module of claim 12 wherein:
    the base substrate defines opposed top and bottom surfaces, the conductive pads being disposed on the top surface and the contacts being disposed on the bottom surface; and
    the memory die is attached to the top surface of the base substrate.

15. The circuit module of claim 11 wherein:
    a second memory die is attached to the memory die;
    the interposer is attached to the second memory die; and
    the controller die is attached to the second memory die.

16. The circuit module of claim 15 wherein:
    the base substrate includes a plurality of conductive pads, each of which is electrically connected to at least one of the contacts; and
    at least one of the terminals of the interposer is electrically connected to a respective one of the pads via a conductive wire.

17. The circuit module of claim 16 wherein:
    the memory die is electrically connected to at least one of the terminals via a conductive wire;
    the second memory die is electrically connected to at least one of the terminals via a conductive wire; and the controller die is electrically connected to at least one of the terminals via a conductive wire.

18. The circuit module of claim 15 wherein layers of epoxy adhesive are used to attach the memory die to the base substrate, the second memory die to the memory die, the interposer to the second memory die, and the controller die to the second memory die.

19. The circuit module of claim 11 wherein the terminals of the interposer are segregated into at least three sets, with at least one of the terminals of a first one of the sets being electrically connected to at least one of the contacts, at least one of the terminals of a second one of the sets being electrically connected to the memory die, and at least one of the terminals of a third one of the sets being electrically connected to the controller die.

20. The circuit module of claim 19 wherein the terminals of the third one of the sets thereof extend along the opening.

* * * * *